(12) United States Patent
Poulin et al.

(10) Patent No.: US 6,278,872 B1
(45) Date of Patent: Aug. 21, 2001

(54) FREQUENCY CONVERTER WITH IMPROVED LINEARITY

(75) Inventors: Grant Darcy Poulin, Carp; Gordon G. Rabjohn, Ottawa; John J. Nisbet, Nepean, all of (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/173,752

(22) Filed: Oct. 16, 1998

(51) Int. Cl.[7] ....................................................... H04B 1/28
(52) U.S. Cl. .......................... 455/333; 455/326; 327/113
(58) Field of Search .................................. 455/323, 326, 455/330, 333; 327/113, 114, 115, 116, 117, 118, 119, 120, 121, 122, 123

(56) References Cited

U.S. PATENT DOCUMENTS

| | | | | |
|---|---|---|---|---|
| 4,709,410 | * | 11/1987 | Tajima et al. | 455/333 |
| 5,280,648 | * | 1/1994 | Dobrovolny | 455/326 |
| 5,438,693 | * | 8/1995 | Cox | 455/333 |
| 5,606,738 | * | 2/1997 | Onodera et al. | 455/333 |
| 5,767,726 | * | 6/1998 | Wang | 455/333 |
| 5,826,183 | * | 10/1998 | Apel | 455/326 |
| 5,898,913 | * | 4/1999 | Pengelly et al. | 455/326 |
| 6,026,287 | * | 2/2000 | Puechberty et al. | 455/333 |

OTHER PUBLICATIONS

"Microwave Mixers," Second Edition, Norwood, MA, Artech House, 1993, pp. 333–369, by S.A. Maas.

Maas, S.A., "A GaAs MESFET Mixer with Very Low Intermodulation", IEEE Transactions on Microwave Theory Techniques, MTT–35, 1987, pp. 425–429.

Pavio, A.M. et al., "Double Balanced Mixers Using Active and Passive Techniques", IEEE Transactions on Microwave Theory Techniques, MTT–36, 1988, pp. 1948–1956.

Weiner, S., Neuf, D., Spohrer, S., "2 to 8 GHz Double Balanced MESFET Mixer with +30 dBm Input 3rd Order Intercept", 1988, IEEE MTT–S Digest, pp. 1097–1100.

* cited by examiner

Primary Examiner—Nay Maung
Assistant Examiner—Quochien B. Vuong

(57) ABSTRACT

A frequency converters used in communications receivers. Such frequency converters can be used for converting a signal from a Radio Frequency (RF) to a low frequency suitable for processing such as demodulation. The inventors have made the unexpected discovery that when the gates of the MESFETs of a double-balanced mixer are left open-circuited and allowed to self-bias, the drop in mixer linearity at high LO power levels is reduced thereby increasing the LO power range of operation. This invention can be used as an improved scale-down mixer as well as an upconverter mixer.

9 Claims, 4 Drawing Sheets

FIGURE 2 - MIXER LINEARITY VS LO POWER WITH -1.4V GATE BIAS

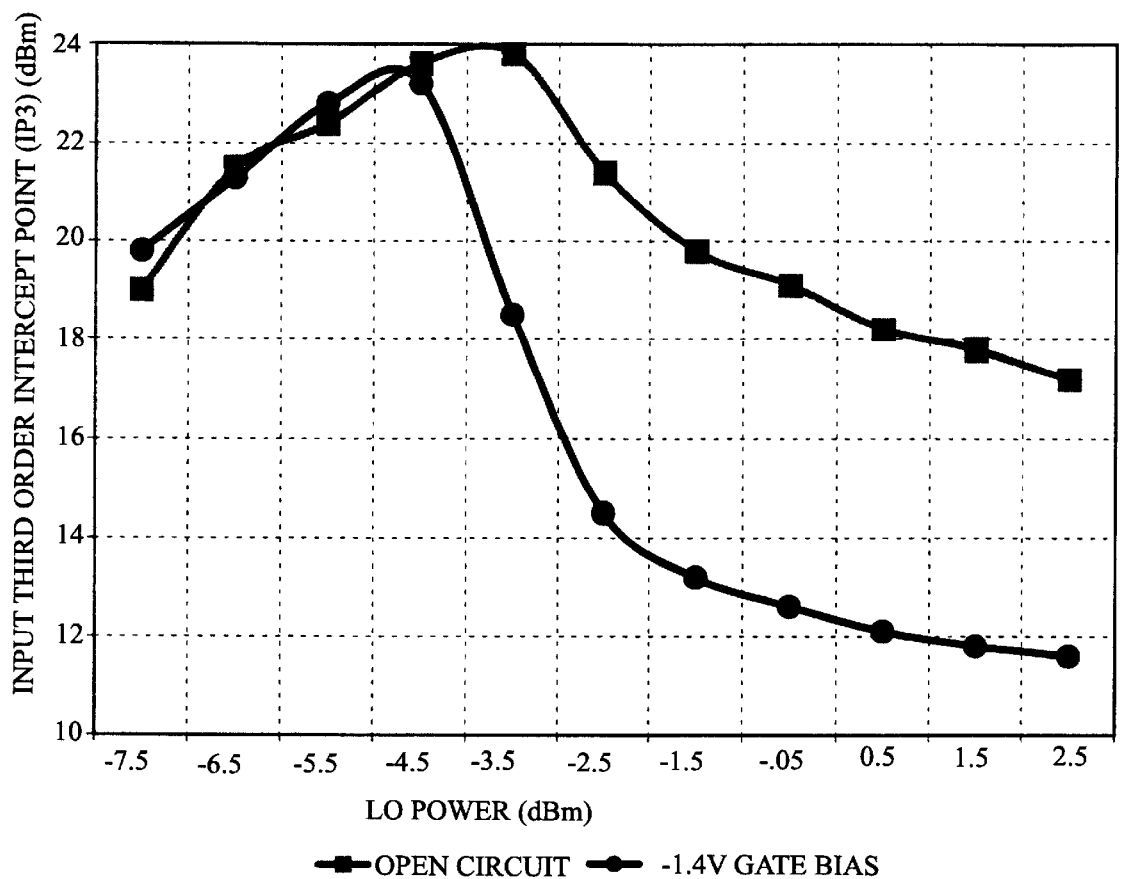

FREQUENCY CONVERTER WITH IMPROVED LINEARITY

FIELD OF THE INVENTION

The present invention relates to frequency converters used in communications receivers. Such frequency converters can be used for converting a signal from a Radio Frequency (RF) to a low frequency suitable for processing such as demodulation or vice versa.

BACKGROUND OF THE INVENTION

Frequency converters, more commonly called "mixers", are employed in communication receivers. They are used for converting an RF signal, transmitted over the air medium, to a lower frequency signal suitable for demodulation in a receiver. Double-balanced Metal-Semiconductor Field Effect Transistor (MESFET) mixers are frequently used in RF receivers. Double-balanced mixers are well-known to those skilled in the art and the reader is invited to consult "Microwave Mixers", Second Edition, Norwood, Mass., Artech House, 1993, pp. 333–369, by S. A. Maas for further information on this subject. This document is hereby incorporated by reference.

One of the parameters of a mixer is its linearity, which can be defined as the level or correlation between the output signal and the input signal. Such correlation is typically a linear relationship between the output signal and the input signal. A high level of linearity allows to reduce the amount of distortion in the output. Linearity is important since it defines the dynamic range of a receiver. Considerable effort has therefore been expended to improve the linearity of mixers.

A common technique used to quantify the linearity of a communications receiver is to specify its Input Third Order Intercept Point (IP3). This technique uses two closely spaced (in terms of frequency) sinusoidal tones applied to the RF input of the receiver. Non-linearities in the receiver circuitry give rise to harmonics in the output signals corresponding to the two sinusoidal tones. Most of these harmonics are far outside the passband of the receiver, so are of little concern. However, the third order terms comprising the second harmonic of one tone and the fundamental frequency of the other tone will fall within the passband, and can therefore cause interference that can not be filtered. It is important to reduce the non-linearities that generate these third order terms to reduce interference and expand the dynamic range of the receiver. IP3 therefore provides a good evaluation of the linearity of a receiver. It follows that higher values of IP3 (measured in dBm) results in a more linear receiver.

In down-converting MESFET mixers, three inputs are required. One input is the RF input signal and the second input is a Local Oscillator (LO) signal. The mixer combines these signals and generates an output at a lower intermediate frequency. Essentially, the RF input is multiplied by an LO frequency signal to produce a lower intermediate frequency (the output). At the first two inputs and at the output, balanced/unbalanced transformers (baluns) are used to convert the signals from single ended to differential. This architechture is known to improve IP3 and port to port isolation. Also, in the LO balun, a center tap is used and allows a Direct Current (DC) bias (the third input) to be applied to the gates of the MESFETs in the mixer. The DC bias is used as a level shifter and shifts the peak LO voltage level down so that the gate does not go into forward conduction. For more information on this topic, the reader is invited to consult the following references describing the DC bias: Maas, S. A., "A GaAs MESFET Mixer with Very Low Intermodulation", IEEE Transactions on Microwave Theory Techniques, MTT-35, 1987, pp. 425–429; Pavio, A. M. et al., "Double Balanced Mixers Using Active and Passive Techniques", IEEE Transactions on Microwave Theory Techniques, MTT-36, 1988, pp. 1948–1956; and, Weiner, S., Neuf, D., Spohrer, S., "2 to 8 GHz Double Balanced MESFET Mixer with +30 dBm Input 3rd Order Intercept", 1988, IEEE MTT-S Digest, pp. 1097–1100. The above documents are hereby incorporated by reference.

The linearity of a mixer is a function of the LO power. Typically, linearity increases as the LO signal power level increases. An on-chip LO buffer amplifier is routinely used to generate the high LO drive required for optimal performance. However, when the LO drive extends beyond a threshold value, the gate current of the MESFETs increases rapidly and the mixer linearity rapidly decreases as the gate-to-channel junction goes into forward conduction. This phenomenon is described at page 342 of "Microwave Mixers", Second Edition, by S. A. Maas referred to earlier.

Due to manufacturing process variations in electronic components, there is often a wide variation in the LO power that is applied to the mixer. Against this background, it appears that it would be beneficial to operate the mixer with as large a LO signal power level as possible thereby enhancing linearity and, ultimately, the dynamic range of the communications receiver. Improvements in mixer linearity and in receiver dynamic range result in reduction in the bit error rate and a wider range of operating conditions.

OBJECTIVES AND SUMMARY OF THE INVENTION

An object of the invention is to provide a novel frequency converter for converting a signal at a first frequency to a signal at a second frequency, that offers an improved linearity.

An object of the invention is to provide a novel frequency converter for converting a signal at a first frequency to a signal at a second frequency, that can be operated at a higher LO signal power, without affecting the linearity of the frequency converter to the extent observed with prior art devices.

Yet, another object of the invention is to provide a novel method for operating a frequency converter for converting a signal at a first frequency to a signal at a second frequency, allowing to increase the power level of the LO signal, without affecting the linearity of the frequency converter to the extent observed with prior art devices.

As embodied and broadly described herein, the invention also provides a frequency converter for converting a signal at a first frequency to a signal at a second frequency, said frequency converter including:

a. a first input for receiving an input signal at the first frequency;

b. a second input for receiving an oscillator signal characterized by a frequency that determines a frequency difference between the first frequency and the second frequency;

c. a processing stage coupled to said first input and to said second input, said processing stage including a plurality of transistors associated by pairs, each pair of transistors including a first transistor and a second transistor, each transistor including a gate terminal, the gate terminals of said first transistor and the gate terminal of said second transistor being coupled to one another, the first and second transistors being in a self-biased condition; and d. an output coupled to said processing stage for generating the signal at the second frequency.

In a specific example, the processing stage of the frequency converter includes four MESFET transistors in a bridge configuration. In such configuration, the transistors are associated by pairs, the gate terminals of the transistor in a pair being coupled to one another. A characterizing element of the invention is that the paired transistors are self-biased. This implies that no external bias is applied to their gate terminals. The present inventors have observed that when the transistors are self-biased the drop in mixer linearity at high LO power levels is reduced thereby increasing the LO power range of operation.

Depending on its input and output, this invention may be used as an improved scale-down mixer as well as an up-converter mixer. In other words, the frequency converter may be used to reduce the frequency of a signal or to increase the frequency of the signal.

BRIEF DESCRIPTION OF THE DRAWINGS

FIG. 4 is a graph comparing IP3 values for the prior art mixer of FIG. 1 and the mixer of FIG. 3, built in accordance with this invention, as a function of LO power.

DESCRIPTION OF A PREFERRED EMBODIMENT

The main purpose of a MESFET mixer is to convert a signal from an RF signal to a lower frequency signal as efficiently as possible. That is, the sinusoidal input has to be reproduced at the output as accurately as possible but at a frequency that can be processed by other electronic components.

Figure 1:
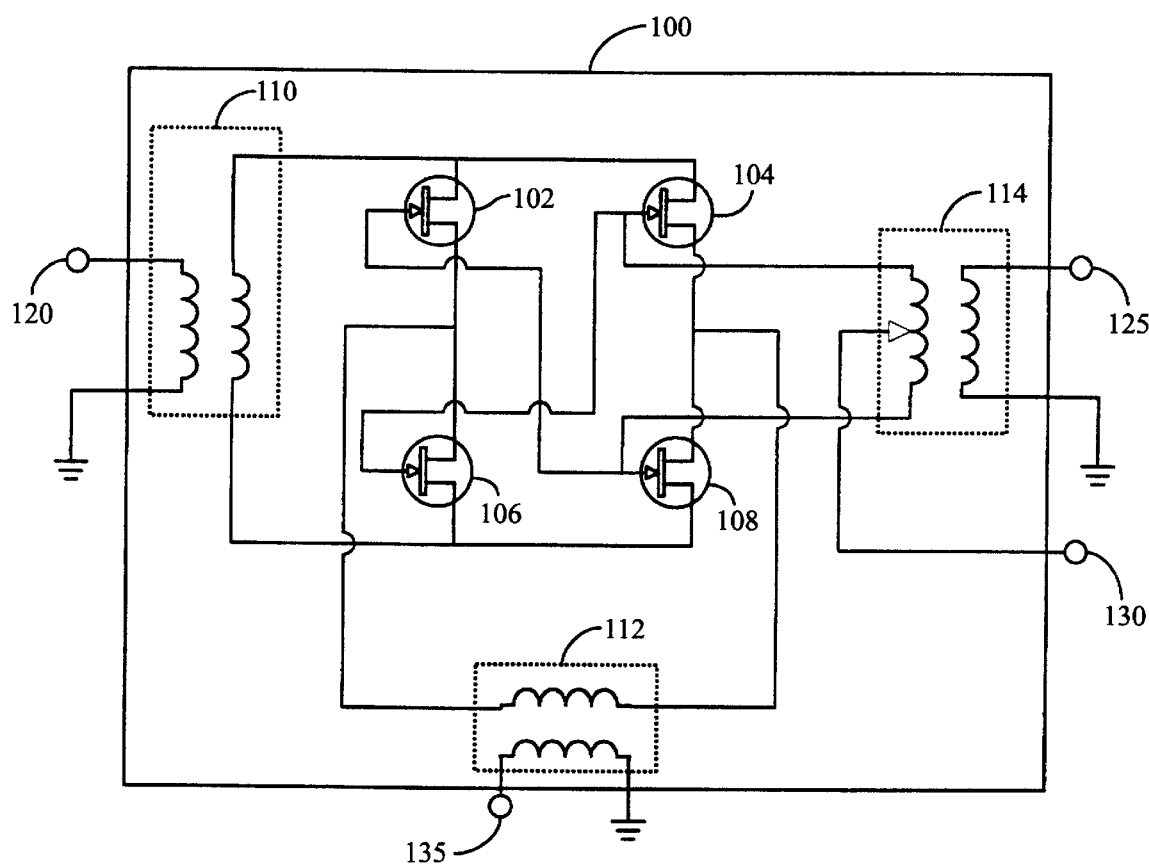
FIG. 1 is a circuit diagram of a prior art double-balanced MESFET mixer.

FIG. 1 shows a circuit diagram of a typical prior art double-balanced MESFET mixer 100. Three inputs are required in mixer 100. The first input 120 is the RF signal (of sinusoidal form) as received from the air medium. The second input 125 is a signal provided by a Local Oscillator (LO) of the communications receiver (not shown). The LO signal may be a clipped sine wave or a square wave. The third input 130 is a DC bias that is applied to the gates of the four MESFETs (102, 104, 106 and 108). In a specific embodiment of the prior art mixer, the gate bias voltage is −1.4V.

The output 135 is an intermediate frequency signal (lower than RF) that can be demodulated by other electronic components in the receiver (not shown). Such processing is typically an operation to demodulate the signal.

Three baluns are required in MESFET mixer 100. These are the balun 110 at the input or RF stage, the balun 114 at the LO input stage and the balun 112 lower frequency or output stage. The purpose of the RF 110 and LO 114 baluns is to convert the input signals, 120 and 125 respectively, from the single ended form to the differential form. This is known to increase IP3 and to improve port to port isolation. The purpose of the output stage balun 112 is to convert the differential signal from the outputs of the MESFETs to a single ended signal and also to improve port to port isolation.

On the single ended signal side of each balun (110, 112 and 114), one end is connected to the input (for baluns 110 and 114) and to the output (for balun 112), while the other end is connected to ground. On the differential signal side of balun 110, one end is connected to the drain of unpaired MESFETs (i.e., 102 and 104), while the other end of balun 110 is connected to the drain of the other unpaired MESFETs (i.e., 106 and 108). On the differential signal side of balun 112, one end is connected to the source of unpaired MESFETs (i.e., 102 and 104), while the other end of balun 112 is connected to the source of the other unpaired MESFETs (i.e., 106 and 108). On the differential signal side of balun 114, one end is connected to the gate of a pair of MESFETs (i.e., 102 and 108), while the other end of balun 114 is connected to the gate of the other pair of MESFETs (i.e., 104 and 106).

The four identical MESFETs (102, 104, 106 and 108) shown are used in a bridge configuration. The LO signal 125 switches opposite pairs of MESFETs (i.e., 102 and 108 form one pair and 104 and 106 form the other) from a low impedance "ON" state to a high impedance "OFF" state. This polarity reversing switching essentially multiplies the input RF signal 120 by the LO input signal 125. It is this switching that results in frequency conversion.

The gate terminals of the transistors in each pair are connected to one another. In addition, the gate terminals are connected to one terminal of the balun transformer 114 to which is applied the DC biasing voltage at input 130.

Figure 2:
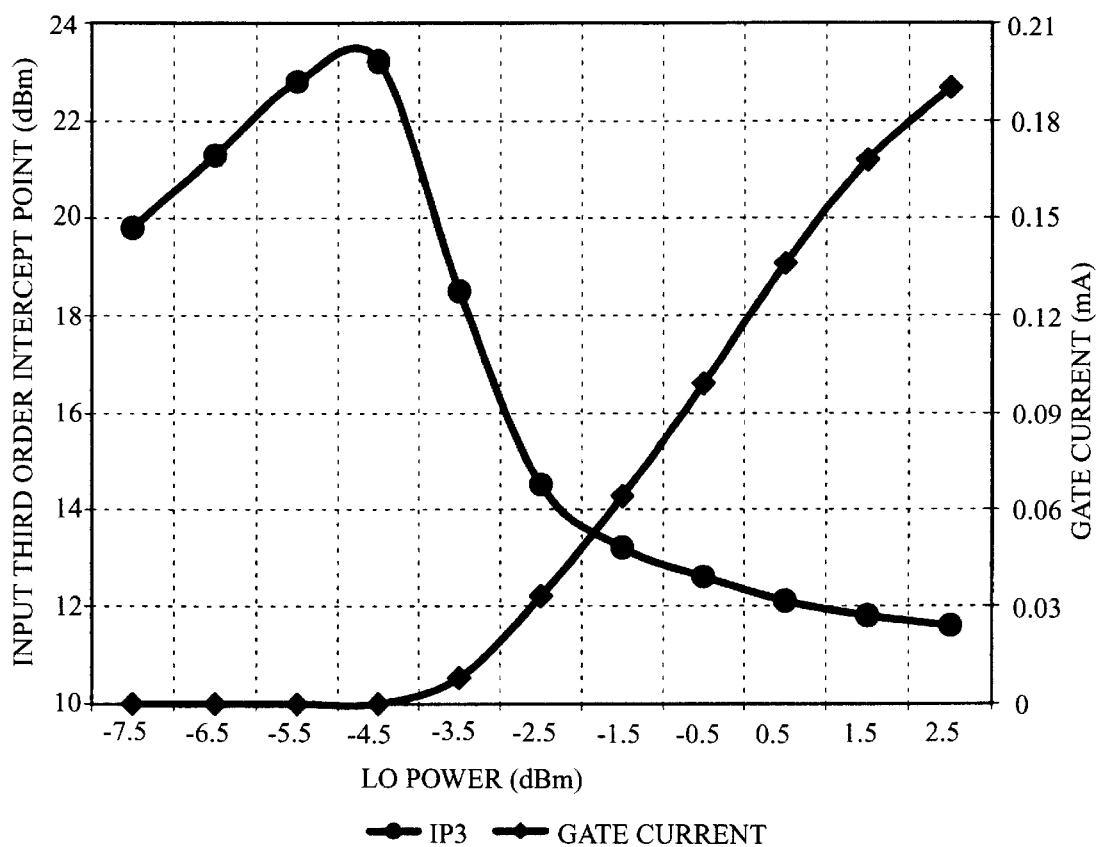
FIG. 2 is a graph showing IP3 and gate conduction current as a function of Local Oscillator (LO) power for the prior art mixer of FIG. 1.

FIG. 2 is a graph showing IP3 and gate conduction current as a function of LO power for the MESFET mixer 100 of FIG. 1. This graph shows that as the LO power increases beyond −4 dBm, linearity decreases rapidly (i.e., IP3 levels drops), and the DC current in the gate increases as the gate-to-channel junction goes into forward conduction. In this example, the operational range of the mixer is limited to LO powers below −4 dBm. Because of electronic component production process variations, it would be useful to permit the use of a wider variation in the LO power that can be applied to the mixer.

Figure 3:
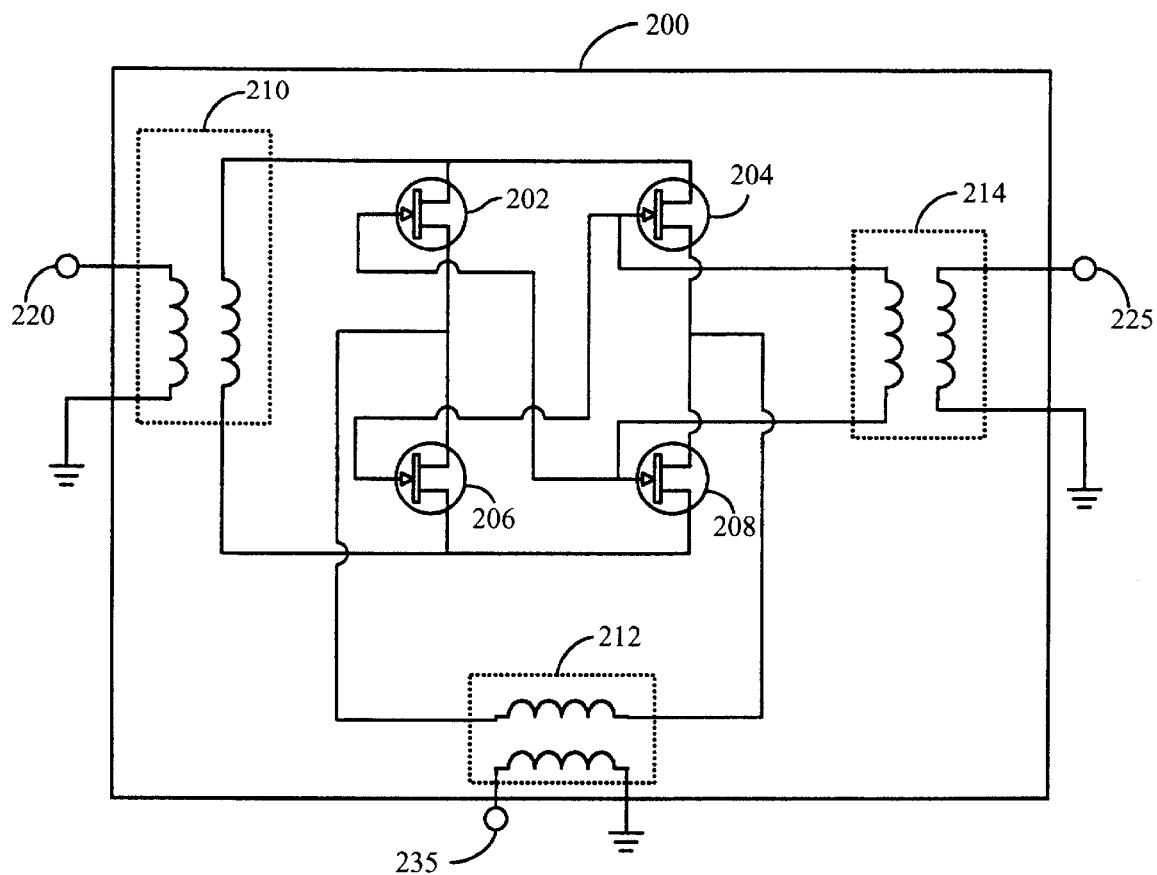
FIG. 3 is a circuit diagram of a double-balanced MESFET mixer in accordance with a preferred embodiment of the invention.

FIG. 3 is a circuit diagram of a double-balanced MESFET mixer 200 in accordance with an embodiment of the invention. The mixer 200 is identical to the mixer 100 of FIG. 1 with the exception of the lack of the third input 130, which is the DC bias applied to the gates of the four MESFETs. The MESFETs' (202, 204, 206 and 208) gates are not biased and are left open-circuited. The inventors have discovered that when the gates are allowed to float and self-bias, linearity is substantially increased as shown in FIG. 4. Mixer 200 fills the same purpose and is therefore interchangeable with mixer 100.

FIG. 3 shows only two inputs to mixer 200. The first input 220 is the RF signal (of sinusoidal form) as received from the air medium. The second input 225 is a signal provided by a Local Oscillator (LO) of the communications receiver (not shown).

As in FIG. 1, the output 235 in FIG. 3 is an intermediate frequency signal (lower than RF) that can be demodulated by other electronic components in the receiver (not shown).

Three baluns are required in this MESFET mixer 200. These are the balun 210 at the input or RF stage, the balun 214 at the LO input stage and the balun 212 at the lower frequency or output stage. The purpose of the RF 210 and LO 214 baluns is to convert the input signals, 220 and 225 respectively, from the single ended form to the differential form. This is known to increase IP3 and to improve port to port isolation. The purpose of the output stage balun 212 is to convert the differential signal from the outputs of the MESFETs to a single ended signal and also to improve port to port isolation.

On the single ended signal side of each balun (210, 212 and 214), one end is connected to the input (for baluns 210 and 214) and to the output (for balun 212), while the other end is connected to ground. On the differential signal side of balun 210, one end is connected to the drain of unpaired MESFETs (i.e., 202 and 204), while the other end of balun 210 is connected to the drain of the other unpaired MESFETs (i.e., 202 and 204). On the differential signal side of balun 212, one end is connected to the source of unpaired MESFETs (i.e., 202 and 204), while the other end of balun 212 is connected to the source of the other unpaired MESFETs (i.e., 202 and 204). On the differential signal side of balun 214, one end is connected to the gate of a pair of MESFETs (i.e., 202 and 208), while the other end of balun 214 is connected to the gate of the other pair of MESFETs (i.e., 204 and 206).

The four identical MESFETs (202, 204, 206 and 208) shown are used in a bridge configuration. The LO signal 225 switches opposite pairs of MESFETs (i.e., 202 and 208 form one pair and 204 and 206 form the other) from a low impedance "ON" state to a high impedance "OFF" state. This polarity reversing switching essentially multiplies the input RF signal 220 by the LO input signal 225. It is this switching that results in frequency conversion.

The device in FIG. 3 can also be used as an up-converter; that is, a mixer that convert a modulated signal from the electronic components of the receiver to an RF signal to be sent on the air medium. The only changes are the definitions of the input and the output. In the case of an up-converter version of mixer 200, the two inputs are input 235, which is an intermediate frequency signal (lower than RF) that was modulated by other electronic components in the receiver (not shown), the second input 225 is a signal provided by a Local Oscillator (LO) of the communications receiver (not shown). The output 220 is the RF signal (of sinusoidal form) to be sent on the air medium. All other components of mixer 200 remains the same.

In a specific embodiment of this invention, the four MESFETs (202, 204, 206 and 208) are made of Gallium Arsenide (GaAs) material. In other embodiments the MESFETs can be replaced by polymorphic High Electron Mobility Transmission (pHEMT) devices.

FIG. 4 is a graph comparing IP3 values for the prior art mixer 100 of FIG. 1 and the mixer 200 of FIG. 3, built in accordance with this invention, as a function of LO power. As shown by the "Open circuit" line, the linearity of mixer 200 suffers when the LO power increases beyond −3.5 dBm, but the linearity reduction is substantially less when compared to that of mixer 100 (i.e., the "−1.4V gate bias" line). For example, at an LO power level of 0 dBm, IP3 has only dropped by 5.6 dBm from its peak value using mixer 200. By comparison, a drop of 11.2 dBm in IP3 is present when using mixer 100.

The above description of a preferred embodiment of the present invention should not be read in a limitative manner as refinements and variations are possible without departing from the spirit of the invention. The scope of the invention is defined in the appended claims and their equivalents.

We claim:

1. A frequency converter for converting a signal at a first frequency to a signal at a second frequency, said frequency converter including:

a. a first input for receiving an input signal at the first frequency;

b. a second input for receiving an oscillator signal characterized by a frequency that determines a frequency difference between the first frequency and the second frequency;

c. a processing stage coupled to said first input and to said second input, said processing stage including a plurality of transistors associated by pairs, each pair of transistors including a first transistor and a second transistor, each transistor including a gate terminal, the gate terminals of said first transistor and the gate terminal of said second transistor being coupled to one another, the first and second transistors being in a self-biased condition; and d. an output coupled to said processing stage for generating the signal at the second frequency.

2. A frequency converter as defined in claim 1, wherein said processing stage multiplies the input signal by the oscillator signal.

3. A frequency converter as defined in claim 2, wherein said processing stage includes four transistors grouped in two pairs.

4. A frequency converter as defined in claim 3, wherein said four transistors are arranged in a bridge configuration.

5. A frequency converter as defined in claim 4, wherein transistors are metal semiconductor field effect transistors.

6. A frequency converter as in claim 4, wherein said metal semiconductor field effect transistors are gallium arsenide metal semiconductor field effect transistors.

7. A frequency converter as in claim 4, wherein said transistors are polymorphic High Electron Mobility Transmission (pHEMT) devices.

8. A frequency converter as defined in claim 1, wherein the first frequency is higher than the second frequency.

9. A frequency converter as defined in claim 1, wherein the first frequency is lower than the second frequency.

* * * * *